United States Patent [19] [11] 3,815,030
Morrison [45] June 4, 1974

[54] SQUARE WAVE DRIVEN POWER AMPLIFIER

[75] Inventor: Heber J. Morrison, Ellicott City, Md.

[73] Assignee: Westinghouse Electric Corporation, Pittsburgh, Pa.

[22] Filed: July 13, 1973

[21] Appl. No.: 379,156

[52] U.S. Cl. .................................... 328/27, 328/14
[51] Int. Cl. .......................................... G06g 17/00
[58] Field of Search .................. 328/27, 28, 14, 62; 307/229

[56] References Cited

UNITED STATES PATENTS

| | | | |
|---|---|---|---|
| 3,512,092 | 5/1970 | Thurnell | 328/14 |
| 3,710,276 | 1/1973 | Dao | 328/27 |

*Primary Examiner*—John S. Heyman
*Assistant Examiner*—B. P. Davis
*Attorney, Agent, or Firm*—C. L. O'Rourke

[57] ABSTRACT

A high power semiconductor amplifier which may be used as a power amplifier for low frequency apparatus such as radio transmitters and/or welding apparatus. A plurality of transistor driven amplifier sections are commonly driven by a square wave source and are coupled in parallel to a common load through loosely electro-magnetic coupled transformers or inductances forming the power combiner circuit. The loose coupling provides a desired low distributive capacitance and high leakage inductive reactance. Each amplifier driver section moreover is coupled to the transformer by a DC blocking capacitor having a selected capacitance value so that a series resonant circuit is formed with the combiner circuit leakage reactance near the center of the operating frequency band. Furthermore, the combiner circuit is coupled to the load by means of a harmonic filter having a series inductance input which acts to present a high reactive impedance to harmonics in the square wave voltage applied thereto so that a substantially sine wave of voltage and current is applied to the load.

11 Claims, 5 Drawing Figures

SQUARE WAVE DRIVEN POWER AMPLIFIER

BACKGROUND OF THE INVENTION

1. Field of the Invention

This invention relates to electrical power amplifier apparatus including a plurality of transistors operated in parallel and more particularly to means for combining the outputs of a plurality of square wave driven transistor amplifier sections at an unfiltered level and then providing the required filtering at the output side feeding the load.

2. Description of the Prior Art

In large class D transistor power amplifiers for transmitters and the like, there are many hundreds of transistors in which it has been the practice to divide the transistors into subgroups of a relatively small number of transistors with each group being operated as a single ended push-pull amplifier. Such circuits are well known and described, for example. in U.S. Pat. No. 3,239,772 issued to T. L. Dennis, Jr., and U.S. Pat. No. 3,239,771 issued to J. H. Andreatta. Both of these patents are assigned to the assignee of the present invention.

The significant problem encountered, however, has been the large number of individual tuned filters provided for each group to isolate it from the common power combining circuitry. The filters, as well as the required isolation and impedance changing transformer have not only been costly, but bulky, heavy and subject to failure, especially when tuning relays are required to cover a wide range of operating frequencies. The individual filters have been necessitated by the difference in phasing and symmetry of the square waves produced from the sine wave driven groups. The sine wave drive was considered to be ideal because it matched the sinusoidal transistor collector current; however, it was not a precise source of a definite demarcation of the half cycle points because of the sloping zero cross-over. These variations in zero cross-over make the output square wave transitions susceptible to timing variations because of variations from group to group in transistor gain, storage time, and tuning. This problem was also recognized in U.S. Pat. No. 3,652,947, entitled "Power Amplifier Including Plurality of Push-Pull Amplifier Sections Having Outputs Coupled in Parallel", G. C. Hollingsworth, wherein an FM carrier is fed to a power amplifier including a plurality of broadband push-pull transistor amplifier sections which are coupled to the carrier wave and an output circuit by transformers having ferrite cores and closely coupled windings.

SUMMARY

The present invention comprises a relatively high power amplifier comprising a plurality of square wave driven transistor driver sections having respective outputs combined by means of loosely coupled inductive combining circuit means having low distributive capacitance and high leakage reactance. The high leakage reactance is series resonated with a respective DC blocking capacitor coupling each of the amplifier sections to the combining circuit and with the output side of the combining circuit being coupled to a common load by means of a harmonic filter.

DESCRIPTION OF THE PREFERRED EMBODIMENTS

The embodiments of the subject invention illustrated in FIGS. 1–4, inclusive, are alike in the respect that each of the embodiments includes a square wave source 10 having its output commonly coupled to the input of a plurality of driver amplifier circuit sections $14_1$, $14_2$, $14_3$ . . . $14_n$ which may be, for example, configured as a single ended double push-pull transistor amplifier such as shown in FIG. 5. All of the driver circuits $14_1$ . . . $14_n$ are operated simultaneously and in phase, as opposed to a multiplexing arrangement, wherein each of the driver circuits deliver at its respective output an amplified square wave of voltage corresponding to the square wave drive applied by the source 10. The present invention combines the outputs of the driver circuits $14_1$ . . . $14_n$ on an untuned basis by means of respective blocking capacitors $16_1$, $16_2$, $16_3$ . . . $16_n$ coupled between the output of the driver circuits $14_1$, $14_2$, $14_3$ . . . $14_n$ and inductive combining circuit means having high leakage reactance and low distributive capacitance and wherein the capacitance value of the capacitors $16_1$, $16_2$, $16_3$ . . . $16_n$ is selectively chosen to substantially series resonate with the leakage reactance near the center of the operating frequency band. This provides the required isolation between driver sections and in effect causes the output of the combiner means to provide a high power square wave of voltage which is then fed into a resonant network in the form of a harmonic filter 18 which normally includes a series inductance, not shown, in the input thereof to present a high reactive impedance to harmonics in the square wave of voltage while exhibiting a low impedance to the fundamental frequency and which then acts to deliver a substantially sinusoidal voltage and current waveform to the load 20.

Figures 1, 2, 3:
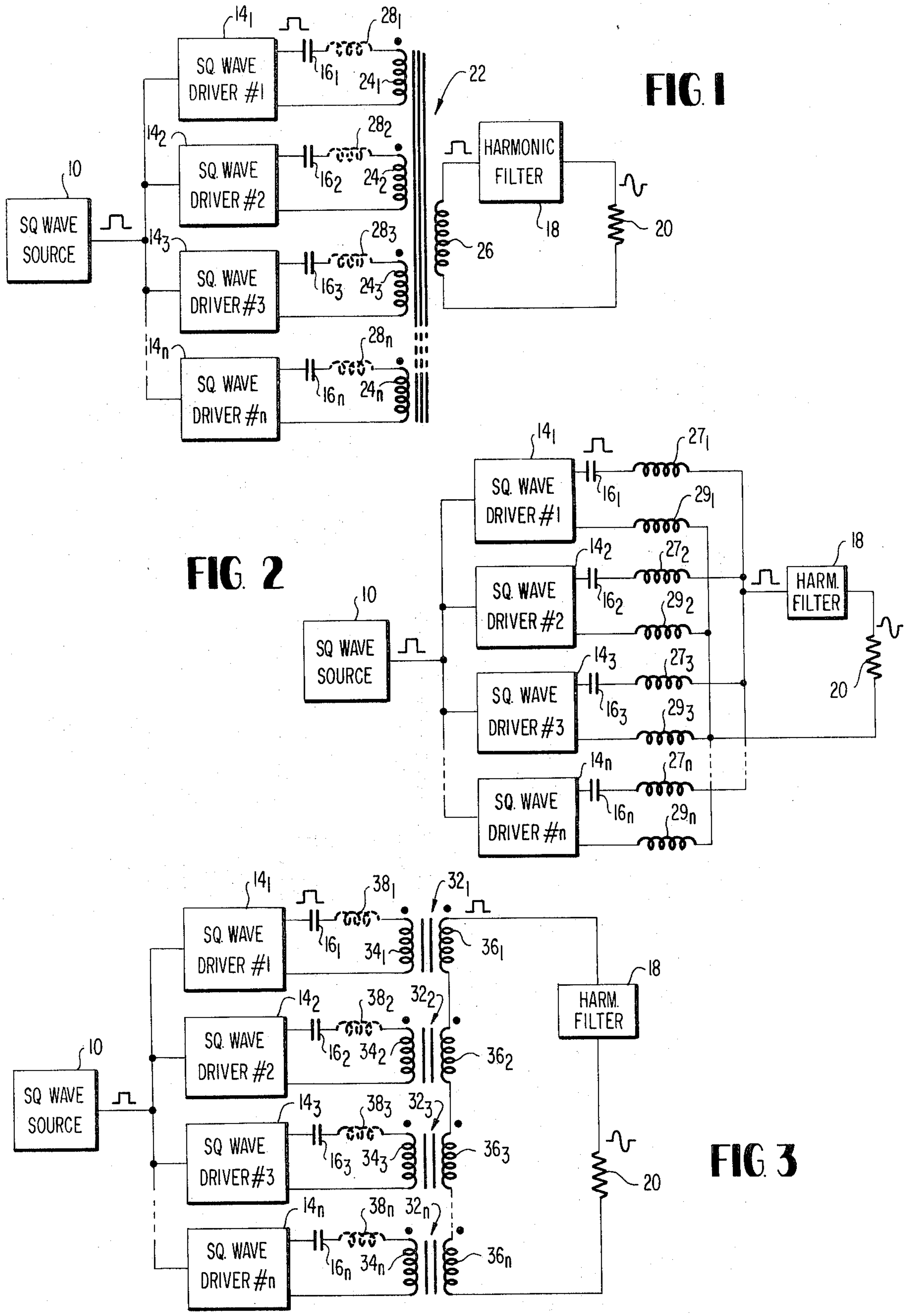
FIG. 1 is an electrical schematic partially in block diagrammatic form illustrative of one embodiment of the subject invention.
FIG. 2 is an electrical schematic partially in block diagrammatic form illustrative of a second embodiment of the subject invention.
FIG. 3 is an electrical schematic partially in block diagrammatic form illustrative of yet another embodiment of the subject invention.

Turning now to the various specific embodiments of the invention, the power combiner circuitry shown in FIG. 1 comprises a single transformer 22 having a plurality of input windings $24_1$, $24_2$, $24_3$ . . . $24_n$ and a common secondary winding 26. The combining transformer 22 is constructed with loose electro-magnetic coupling, that is one having primary and secondary windings spaced relatively far apart in order to obtain low distributive capacitance with respect to ground and relatively high leakage reactance. This is depicted schematically by the phantom inductances designated by reference numerals $28_1$, $28_2$, $28_3$ . . . $28_n$, and which are respectively series connected to and series resonate with the DC blocking and coupling capacitors $16_1$, $16_2$, $16_3$ . . . $16_n$. Additionally, when desirable, the transformer leakage reactance can be further enhanced by making the resonant frequency of the transformer relatively high, i.e. at least 10:1 compared to the operating frequency of the square wave input. It should also be noted that all of the primary windings $24_1$ . . . $24_n$ are coupled to the respective driver circuits $14_1$ . . . $14_n$ in the like polarity as indicated by the dots (denotes winding end of like mutual polarity) in the drawing of FIG. 1 by means of the respective capacitors $16_1$ . . . $16_n$. Thus all of the outputs of the driver circuits $14_1$ . . . $14_n$ combine in phase with the phase coincidence being further enhanced by the square wave drive as opposed to the sloping zero cross-over provided by sine wave drive as taught in the Dennis Patent, U.S. Pat. No. 3,239,772.

Referring now to FIG. 2, the embodiment shown therein replaces the transformer 22 shown in FIG. 1 with fixed inductors $27_1$ and $29_1$ . . . $27_n$ and $29_n$, having inductance values corresponding to the leakage reactances $28_1$ . . . $28_n$. The inductors $27_1$ . . . $27_n$ in series with the respective capacitors $16_1$ . . . $16_n$ are commonly connected to the input of the harmonic filter 18 whereas the inductors $29_1$ . . . $29_n$, are commonly connected from the opposite side of the load 20 back to the respective driver circuit $14_1$ . . . $14_n$.

Referring now to the embodiment shown in FIG. 3, this embodiment is similar to the embodiment shown in FIG. 1 with the exception that the single combining transformer 22 shown therein is now replaced with a plurality of transformers $32_1$, $32_2$, $32_3$ . . . $32_n$, each having primary winding $34_1$, $34_2$, etc. and a respective secondary winding $36_1$, $36_2$, etc. The primary windings $34_1$ . . . $34_n$ have like polarity connections to respective capacitors $16_1$ . . . $16_n$ and the secondary windings $36_1$, $36_2$, $36_3$ . . . $36_n$ are connected in series aiding relationship across the series connected harmonic filter 18 and load 20. As with the single combining transformer shown in FIG. 1, all of the transformers $32_1$ . . . $32_n$ comprise loosely coupled transformers having low distributive capacitance and high leakage reactance which is designated by reference numeral $38_1$, $38_2$, $38_3$ . . . $38_n$ connected in series with the respective capacitors $16_1$, $16_2$ . . . $16_n$. Again, the capacitance values of each of the capacitors $16_1$ . . . $16_n$ are selectively chosen such that a substantially series resonant circuit is formed with the leakage reactances $38_1$ . . . $38_n$ near the center of the operating frequency band.

Figure 4:
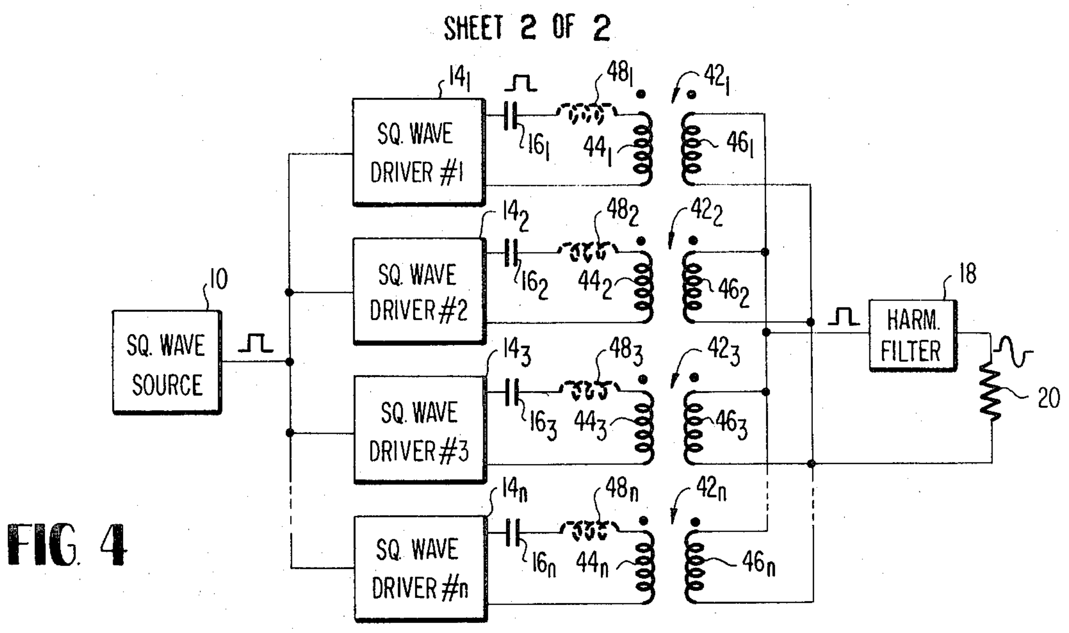
FIG. 4 is an electrical schematic partially in block diagrammatic form illustrative of still another embodiment of the subject invention.
Figure 5:
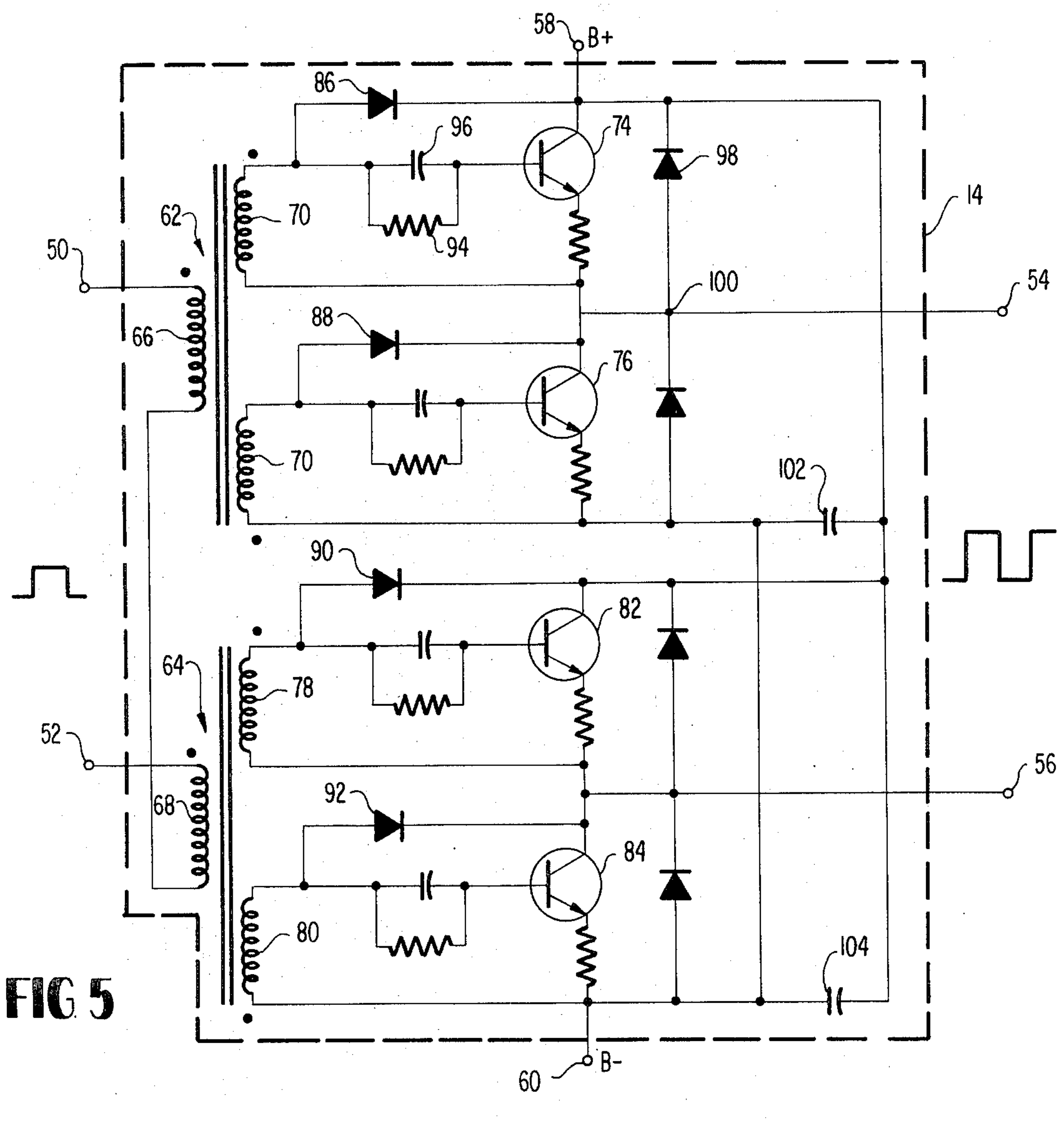
FIG. 5 is an electrical schematic diagram illustrative of one of the plurality of driver sections utilized in connection with the subject embodiments illustrated in FIGS. 1–4, inclusive.

Considering now the embodiment shown in FIG. 4, there is disclosed a power combiner circuit comprised of a plurality of air core transformers $42_1$, $42_2$, $42_3$ . . . $42_n$, having respective input windings $44_1$, $44_2$, etc. and secondary windings $46_1$, $46_2$, etc. These transformers $42_1$ . . . $42_n$ again are constructed such that loose electro-magnetic coupling between primary and secondary windings exists in order to provide the low distributive capacity and high leakage reactance required. The leakage reactance of each of the transformers $42_1$ . . . $42_n$ is represented by reference numeral $48_1$ . . . $48_n$ and is series resonated with the respective capacitor $16_1$ . . . $16_n$. The embodiment shown in FIG. 4 additionally couples all of the secondary windings $46_1$ . . . $46_n$ in parallel aiding relationship as indicated by the polarity dots, with one end being connected to the harmonic filter 18, and the other end connected to the opposite side of the load 20.

In order to operate with a square wave drive without deleterious effects outlined in the Dennis U.S. Pat. No. 3,239,772, the driver circuits $14_1$ . . . $14_n$, when desirable, may be configured as shown in FIG. 5. The circuitry shown in FIG. 5 includes a pair of input terminals 50 and 52 adapted to be coupled to the output of the square wave source 10 and a pair of output terminals 54 and 56 which are adapted to be coupled to the power combining circuit means shown in FIGS. 1 through 4. A B power supply potential coupled from a source, not shown, is coupled thereacross having the positive side thereof coupled to terminal 58 while the opposite or negative side thereof is coupled to terminal 60. The circuit itself comprises a single ended double push-pull amplifier including input transformers 62 and 64 having respective primary windings 66 and 68 coupled in series opposing polarity relationship as indicated by the polarity dots. Transformer 62 has a pair of secondary windings 70 and 72 for operating a pair of series connected transistors 74 and 76. In a like manner, input transformers 64 includes a pair of secondary windings 78 and 80 which are adapted to operate a second pair of series connected transistors 82 and 84. Each of the transistors 74, 76, 82, and 84 additionally include a respective diode 86, 88, 90 and 92 having its cathode connected to the collector of the respective transistor while the anode is connected to the end of the secondary winding coupled to the transistor base. Except for the diodes 86, 88, 90 and 92, the circuit shown in FIG. 5 operates in the manner described with respect to the configuration taught in the Andreatta U.S. Pat. No. 3,239,771. When excess drive power resulting from the square wave input is applied to the drive transformers 62 and 64, the excess is shunted by means of the diodes 86, 88, 90 and 92 to the transistor collectors when the collector to base voltage becomes approximately equal to the bias voltage. The square wave of drive power thus assures that sufficient drive is available throughout the conduction interval of the push-pull operation. Further considering just one of the transistors, for example transistor 74, the capacitor 96 acts to couple the drive signal from the secondary winding 70 to the base of the transistor 74. Additionally, the capacitor 96 acts as a bias voltage storage. The time constant of the parallel combination of resistor 94 and the capacitor 96 is relatively large with resepct to the period of the lowest operating square wave drive frequency. The diode shunted across the transistor 74 conducts at times during the cycle during which the load current appearing at output terminal 54 is not in phase with the square wave of voltage appearing at junction 100. Capacitors 102 and 104 act merely as DC blocking capacitors for B supply potential applied to the two pairs of transistors.

Where for example the transistors 74, 76, 82 and 84 are comprised of high voltage, triple diffused, medium speed units typically of the type identified as 2N3902 transistors for VLF and LF frequency bands, it has been observed that transistor efficiency for the circuit configuration shown in FIG. 5 remains in the order of 0.95 for power factors as low as 0.79 lagging and 0.94 leading. Also, full drive can be applied with light loads. For example, even for an open circuit load condition, dissipation has been found to be only in the order of 1.50 watts in each transistor. By comparison, previous amplifiers were found to be unable to withstand less than 0.97 power factor. Additionally, sustained operation into light loads with full drive was found to cause transistor damage.

Thus the present invention combines transistor amplifier sections on an untuned basis, that is, the square wave output is not filtered on the input side of the combiner circuitry but on the output side. This eliminates the complexity of sine wave combining. Attendant to this, however, one must overcome the problems related to square wave combining which are: (1) non-uniform amplifier load sharing caused by difference in section switching times resulting in intermodulation or jitter; (2) ringing on the secondary or combined side of the combining circuitry caused by a voltage waveform having a large harmonic content, exciting a shunt resonant circuit composed of the leakage reactance and the transformer distributive capacitance to ground; and (3) detuning the harmonic filter by the transformer leakage reactance. The embodiments shown in 1–4 meet the aforesaid problems by the method of driving the plurality of amplifier sections from a common square wave source, controlling the waveform of the transistor amplifier section outputs, minimizing the distributed capacitance of the combining circuitry while making the leakage reactance thereof relatively large, and coupling the respective outputs of the amplifier sections to the combining circuitry with a capacitance which substantially series resonates with the relatively high leakage reactance of the combining circuitry near the center of the operating frequency band.

Having thus described what is at present considered to be the preferred embodiments of the subject invention, I claim:

1. A relatively high power amplifier comprising in combination:

a square wave signal source;

a plurality of signal amplifier sections commonly coupled to the output of said square wave signal source, each amplifier section operating to individually provide an amplified square wave output;

inductive combining circuit means having a relatively low distributed capacitance and a relatively high leakage reactance, coupled to said plurality of amplifier sections and providing a relatively high power square wave output;

respective capacitance coupling means coupling the square wave output of each of said plurality of amplifier sections to said combining circuit means, each coupling means having a selected capacitance value which in combination with said leakage reactance of said combining circuit means is adapted to resonate in the operating frequency band of said square wave signal source;

a resonant network having a low impedance to the fundamental frequency of the square wave output of said combining circuit means while attenuatng the harmonic frequencies of said fundamental frequencies and thereby provide a sine wave output of current and voltage; and a load coupled to the harmonic filter and being responsive to the sine wave of current and voltage provided thereby.

2. The power amplifier as defined by claim 1 wherein said respective capacitance coupling means comprises a respective series connected capacitor coupled between the output of each of said plurality of amplifier sections to said combining circuit means and wherein each said capacitor series resonates with the leakage reactance at said combining circuit means.

3. The high powered amplifier as defined by claim 2 wherein said combining circuit means comprises transformer means.

4. The power amplifier as defined by claim 3 wherein said transformer means comprises a loose electromagnetically coupled transformer having a plurality of primary windings individually coupled to said plurality of amplifier sections and a common output winding coupled to said resonant network.

5. The power amplifier as defined by claim 4 wherein all of said plurality of primary windings are coupled to the respective amplifier sections in the same polarity relationship.

6. The power amplifier as defined by claim 2 wherein said combining circuit means comprises a respective plurality of transformers, each having a loosely coupled primary winding and secondary winding, wherein each of said primary windings is coupled to the respective amplifier section in the same mutual polarity relationship, and wherein the secondary winding of said plurality of transformers are connected in series aiding circuit relationship across said harmonic network and said load, said resonant network and said load being connected in series.

7. The power amplifier as defined by claim 2 wherein said inductive combining circuit means comprises a respective plurality of transformers, each having a primary and a secondary winding and being constructed to have relatively loose electromagnetic coupling therebetween thereby providing relatively low distributive capacitance and relatively high leakage reactance, each primary winding being coupled to the output of a respective signal amplifier section and said secondary winding of said plurality of transformers being selectively connected to said resonant network.

8. The power amplifier as defined by claim 7 wherein each primary winding is coupled to the respective amplifier section in the same mutual polarity.

9. The power amplifier as defined by claim 8 wherein the plurality of secondary windings are coupled in parallel in the same polarity sense to the resonant network.

10. The power amplifier as defined by claim 7 wherein the plurality of transformers are comprised of air core transformers.

11. The power amplifier as defined by claim 2 wherein said resonant network and said load are connected in series and wherein said inductive combining circuit means comprises a first inductor for each of said signal amplifier sections connected to each said capacitor, said series combination being connected to said resonant network, and a second inductor for each of said signal amplifying sections coupled between one side of the load and said respective amplifying section.

* * * * *